United States Patent [19]

Varker

[11] 4,030,190
[45] June 21, 1977

[54] METHOD FOR FORMING A MULTILAYER PRINTED CIRCUIT BOARD

[75] Inventor: Kenneth James Varker, Binghamton, N.Y.

[73] Assignee: International Business Machines Corporation, Armonk, N.Y.

[22] Filed: Mar. 30, 1976

[21] Appl. No.: 671,796

[52] U.S. Cl. .................................. 29/625; 29/628; 174/68.5; 204/15; 427/97; 427/98
[51] Int. Cl.² ...................... B41M 3/08; H05K 3/08; H05K 3/36
[58] Field of Search ............ 29/624, 625, 626, 628; 427/96, 97, 98; 156/3, 2; 204/14 R, 15, 20, 23; 174/68.5; 317/101 A, 101 B

[56] References Cited
UNITED STATES PATENTS

| | | | |
|---|---|---|---|
| 3,508,330 | 4/1970 | Kubik | 427/98 X |
| 3,509,624 | 5/1970 | Boucher | 427/98 X |
| 3,554,877 | 1/1971 | Geisler | 204/15 |
| 3,756,891 | 9/1973 | Ryan | 29/625 X |
| 3,764,436 | 10/1973 | Schmidt et al. | 29/628 X |
| 3,791,858 | 2/1974 | McPherson et al. | 156/3 X |
| 3,799,816 | 3/1974 | Schneble et al. | 156/3 |
| 3,851,382 | 12/1974 | Stork | 29/625 X |
| 3,867,759 | 2/1975 | Siefker | 29/628 |
| 3,913,223 | 10/1975 | Gigoux | 29/625 |

*Primary Examiner*—Victor A. DiPalma
*Attorney, Agent, or Firm*—Cyril A. Krenzer

[57] ABSTRACT

Multilayer printed circuit boards are formed by providing a plurality of board assemblies having appropriate ground, signal and voltage planes. Each assembly is built around a dimensionally stable core to enhance registration between levels and is processed in such a manner that there exists a relative dimensionally stable configuration when performing method steps important to maintain good registration. The assemblies may constitute a completed multilayer board or may be subsequently combined to provide a more complex multilayer printed circuit board.

13 Claims, 5 Drawing Figures

METHOD FOR FORMING A MULTILAYER PRINTED CIRCUIT BOARD

BACKGROUND OF THE INVENTION

1. Field of the Invention

This invention is related to printed circuit boards, and more particularly to an improved method for forming multilayer printed circuit boards.

2. Prior Art

Multilayer printed circuit boards are well known in the art and have advanced to the point where they are becoming more and more capable of supporting high density circuits, modules, etc. Often, in providing the increased density capability for supporting circuitization, it has become necessary to increase the number of signal, ground and voltage planes found in a multilayer printed circuit board, as well as the conductor density in each signal plane. In some applications, in order to minimize the number of interboard connections, it has become desirable to utilize as large and as dense a multilayered printed circuit board as possible. However, as the size of the printed circuit board is increased, it becomes more and more difficult to maintain registration between the various interplanes, because the various interplanes may have different expansion characteristics, especially during the processing steps of forming the printed circuit board. Obviously, the registration problem increases as the number and density of interplanes in the final product is increased.

In the process of forming a printed circuit board, it has been a standard practice in the industry to begin with an insulative base material to circuitize one or both surfaces of the base material and to combine a number of these to form a multilayer board. Typical of the prior art are the processes shown and described in U.S. Pat. Nos. 3,554,877; 3,791,858 and 3,867,759. In U.S. Pat. No. 3,554,877, individual double sided printed circuit boards are laminated together to form a multilayer printed circuit board. Similarly in U.S. Pat. No. 3,867,759, a plurality of strip transmission line printed circuit board segments are used to form a plurality of printed circuit boards with each board to be a layer in and of a multilayer integrated package. In U.S. Pat. No. 3,791,858, a multilayer printed circuit board is produced using additive techniques for forming conductors within each layer of the multilayer board, with the initial layer being built up on an insulative base material, such as of glass cloth-epoxy resin.

Generally, in the process of forming the circuitized assemblies, it is necessary to provide a pluralityof interconnections, commonly called "vias", by drilling holes in the base material and plating interconnections in the "vias" when the surfaces of the base material are circuitized. If the "vias" are not properly aligned with electrical interconnection pads at the end of signal lines forming the circuit patterns, the proper electrical interconnections between the planes cannot be established. Obviously, as the number and density of planes is increased with interconnections therethrough, it becomes especially important that relative absolute registration be maintained.

Inherent in the problems of the prior art devices is that the base building block of the insulative material is somewhat unstable as it is processed through varying temperatures and pressures and subjected to various chemical treatments. As a result, there can be significant shifts in the relative positioning of the circuitized lines built up on the intermediate packages, which provide registration problems in the assembly of a final package. This problem is, as mentioned above, significantly increased as the dimensions and densities of the printed circuit board are increased.

An additional problem that has occurred with prior art processes is that the dielectric base material in addition to being dimensionally unstable is often thin, flexible and fragile. It was not uncommon when plating thin line circuits on such base material to find that the circuit lines would break or rupture as the material was handled, which problem also becomes more significant as the size of the printed circuit board is increased.

OBJECTS AND SUMMARY OF THE INVENTION

It is a principal object of the present invention to provide an improved method for forming multilayer printed circuit boards which overcome the disadvantages of the prior art.

A more specific object of the present invention is to provide an improved method for forming multilayer printed circuit boards which have improved interplane registration.

Yet another object of the present invention is to provide an improved method of forming multilayer printed circuit boards which is both economical and reliable.

Still another object of the present invention is to provide an improved method for forming multilayer printed circuit boards which are dimensionally stable and which can be added together to provide increased density multilayer printed circuit boards.

A more specific object of this invention is to provide a method for forming multilayered printed circuit boards wherein each step of the process which is critical to maintaining registration is performed on an assembly whose dimensions are relatively stable.

The foregoing and other objects are accomplished according to one aspect of the invention wherein the process for forming the multilayer board subassembly begins with a relatively stable solid copper base and builds the signal layer sequentially on the stable copper base. After each dielectric layer is added to the base core, it is cured to establish an inherent dimensional stability with the stable core before a subsequent operation is performed. Interplanar vias are provided in the subassembly as the signal planes are built up on the base core, so that after the vias are formed, the plating for the signal planes including vias may be done using an additive plating process. Subsequently, multiple subassemblies can be laminated together to provide a very high density printed circuit board which can have increased length and width dimensions while maintaining relative dimensional stability.

DESCRIPTION OF THE PREFERRED EMBODIMENT

Figure 1:
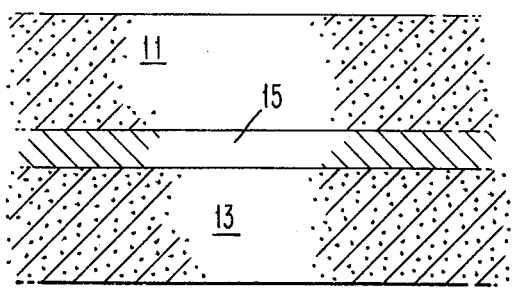
FIGS. 1 through 5 are vertical, sectional views of a printed circuit board subassembly as it is processed according to the steps of the present invention.
Figure 2:
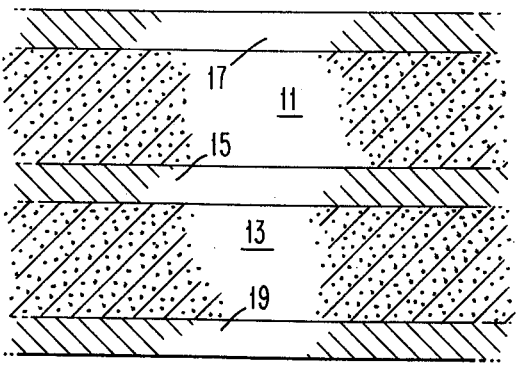

Referring now to FIG. 1, the first step of the process for making a printed circuit board according to the present invention involves the lamination of dielectric materials 11, 13 to opposite sides of a base material 15. The base material 15 could be a ground or voltage plane of the subassembly and might, for example, be 3 mil copper sheet material. The dielectric sheets 11, 13 laminated to opposite sides of the substrate 15 can be any conventional dielectric material used in the preparation of printed circuit boards such as, for example, resin impregnated epoxy glass, with the thickness of the dielectric to be determined by the requirements of the printed circuit board subassembly. A typical thickness is on the order of 12 mils.

After the dielectric sheets 11, 13 have been suitably bonded to the plane 15 and subsequently cured, first signal planes 17, 19 are generated on the exposed surfaces of the dielectrics 11, 13, respectively. These circuitized planes 17, 19 can be developed using either additive or subtractive processes depending upon the particular design preferences or existing system constraints. For example, if a subtractive process is used, a 2 mil copper sheet might be initially laminated to the outer surfaces of the dielectrics 11, 13 and then using standard subtractive techniques, the appropriate circuit design and patterns are developed to yield the circuit planes 17, 19. If an additive process is desired, the process shown and described in co-pending application Ser. No. 651,092, entitled "Method of Manufacturing Printed Circuit Boards" and assigned to the same assignee as is the present invention, can be used to additively plate up the desired circuit planes 17, 19.

Figure 3:
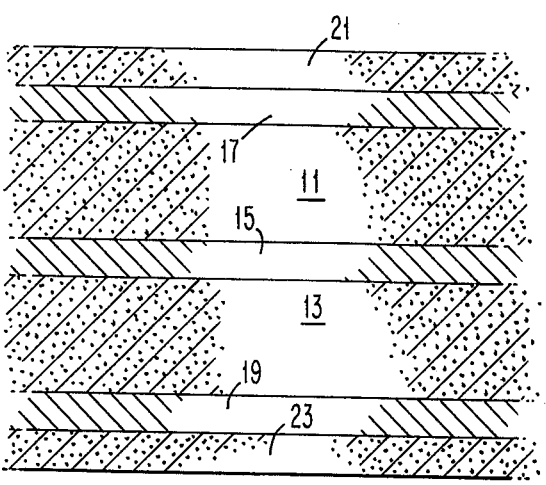
Figure 4:
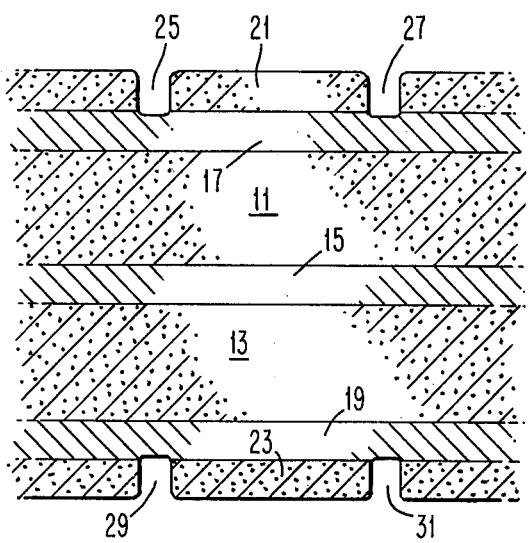

Referring next to FIG. 3, after the circuit surfaces 17, 19 have been developed, second dielectric planes 21, 23 are laminated over the circuit planes 17, 19, respectively. Again the dielectric material may be any suitable dielectric such as resin impregnated epoxy glass, the thickness of which will be determined by the system design requirements. A thickness of the dielectric planes 21, 23 might be 3 to 6 mils. Once the dielectrics are laminated to the surfaces 17, 19, it may be desirable to provide the via holes, which connect the next level of circuits to the circuits of these previously defined circuit planes. In this environment, these holes are known as "blind vias" because the via will not be produced through the entire subassembly, but preferably just reaches the surface of the circuit planes 17, 19. This is best illustrated in FIG. 4 where vias 25 and 27 are selectively created in the dielectric 21 to provide throughputs to the circuit plane 17. Similarly, vias 29, 31 are provided in the dielectric 23 to provide openings for connections to the circuit plane 19.

One of the difficulties involved in providing such vias, which may be between 4 and 16 mils in diameter, is to assure that the via does reach the desired copper signal plane, but does not totally penetrate it or cause an irrepairable rupture in the circuit plane. It has been found that the desired control of the via preparation can be accomplished through the use of a laser drilling system which will create the desired void in the dielectric material 21, 23, but will not penetrate the copper signal pads in the planes 17, 19. This obviates the problem priorally encountered in trying to provide blind vias, wherein it was not uncommon to have the drill totally penetrate a pad in the copper signal plane.

Figure 5:
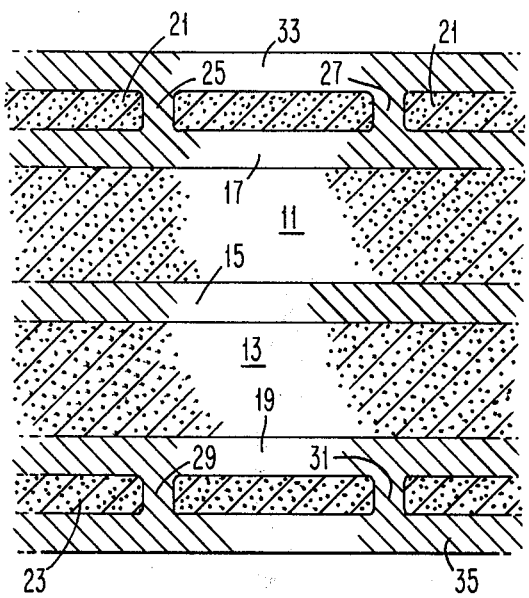

The next step in the process is illustrated in FIG. 5. This is the addition of another pair of circuit planes 33, 35 on top of the dielectrics 21, 23, respectively. Again the circuit patterns in these planes 33, 35 can be provided using any of the well known additive or subtractive processes. Once the circuit planes 33, 35 are properly defined, the plating process produces the signal planes 33, 35 as well as plating the vias 25, 27 and 29, 31. At this juncture there is a well defined subassembly including four signal planes 17, 19, 33 and 35 and a single ground or power plane 15 for all of which the registration is accomplished by reference to the base plane 15 which is relatively unaffected by the various processing steps that are required to generate the subassembly. Therefore, it is possible to combine two or more such subassemblies to provide an overall printed circuit board assembly having multiple ground, power and signal planes which will all be in relatively good registry since the absolute registration with the dimensionally stable starting core 15 has been maintained.

After a circuit board of two or more such subassemblies is provided by laminating the subassemblies together, the necessary through holes (not shown) penetrating the entire board can be produced using conventional drilling techniques to establish the necessary connections to the internal conductive planes.

Throughout this process it is then readily apparent that all the developed circuit patterns, etc. are attached to a relatively stable base. This provides an inherently stronger assembly with significantly improved reliability of registration. As a result it is possible to produce large circuit boards with high circuit line densities of high quality and reliability.

While the invention has been particularly shown and described with reference to a preferred embodiment thereof, it will be understood by those skilled in the art that various changes in form and details may be made therein without departing from the spirit and scope of the invention. For example, while the base plane has been described as a voltage or ground plane, it may also be primarily a heat sink and its thickness may vary from a few tenths of a mil to many tens of mils. Similarly, the thickness of the dielectric planes may vary depending upon design choice or system constraints. Further, the base plane need not be totally solid sheet, but rather may include select openings therein. The main requirement is that it have substantial dimensional stability. Also, while the preferred metal for the base material is copper, there will be situations where other metals including copper alloys may be used.

It is therefore intended that the invention not be limited to the specifics of the foregoing detailed description of the preferred embodiment, but rather is to embrace the full scope of the following claims.

I claim:

1. A method of manufacturing a multilayer printed circuit board including at least one base plane of inherently stable, conductive material and a plurality of signal planes, comprising the steps of:
    adding first and second dielectric planes on the sides of said base plane;
    creating first and second signal planes on said first and second dielectric planes, respectively;
    adding third and fourth dielectric planes over said first and second signal planes, respectively; and
    creating respective third and fourth signal planes on said third and fourth dielectric planes.

2. The invention according to claim 1 wherein said base plane is made of copper sheet material.

3. The invention according to claim 1 additionally comprising the step of creating selective blind vias through said third and fourth dielectrics to said first and second signals planes, respectively, prior to creating the respective third and fourth signal planes on said third and fourth dielectric planes.

4. The invention according to claim 1 wherein said dielectric planes are added by a lamination process.

5. The invention according to claim 1 wherein said signal planes are created by an additive plating process.

6. The invention according to claim 3 wherein the step of creating respective third and fourth signal planes on said third and fourth dielectric planes includes plating through said vias to thereby provide interconnections between said adjacent signal planes.

7. The invention according to claim 1 wherein said base plane is a ground plane.

8. The invention according to claim 1 wherein said base plane is a power plane.

9. The invention according to claim 3 wherein said selective creating of vias to said signal planes is accomplished using a laser drilling beam.

10. The invention according to claim 1 wherein each of said dielectric planes is made of epoxy glass impregnated with resin.

11. A method of manufacturing a multilayer printed circuit board subassembly including at least one base plane of conductive material and a plurality of signal planes, comprising the steps of:
  laminating first and second dielectric planes on the sides of said base plane;
  curing said first and second dielectric planes;
  plating first and second signal planes of conductive material on said first and second dielectric planes, respectively;
  laminating third and fourth dielectric planes over said first and second signal planes, respectively;
  curing said third and fourth dielectric planes;
  creating selective vias through said third and fourth dielectrics to said first and second signal planes, respectively; and
  plating third and fourth signal planes on said third and fourth dielectric planes, respectively including plating said vias to thereby provide interconnections between said first and third signal planes and between said second and fourth signal planes.

12. A method of manufacturing a composite multilayer printed circuit board comprising the steps of:
  making a plurality of printed circuit board subassemblies according to the method of claim 11; and
  laminating said plurality of printed circuit board subassemblies together.

13. The invention according to claim 12 additionally comprising:
  creating a plurality of through holes through said composite multilayer printed circuit board; and
  plating said plurality of through holes with a conductive metal.

* * * * *